(12) United States Patent
Du et al.

(10) Patent No.: US 6,751,784 B2
(45) Date of Patent: Jun. 15, 2004

(54) IMPLEMENTATION OF NETWORKS USING PARALLEL AND SERIES ELEMENTS

(75) Inventors: Tan Du, Plano, TX (US); David Jaska, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 10/217,285

(22) Filed: Aug. 12, 2002

(65) Prior Publication Data

US 2004/0031002 A1 Feb. 12, 2004

(51) Int. Cl.$^7$ ................................................. G06F 17/50
(52) U.S. Cl. ............................... 716/7; 330/129; 716/1; 716/5; 716/6; 716/8
(58) Field of Search ......................... 708/493; 327/513; 716/1, 5, 6, 7, 8; 330/129

(56) References Cited

U.S. PATENT DOCUMENTS 6,512,416 B2 * 1/2003 Burns et al. ................. 330/129

* cited by examiner

*Primary Examiner*—Vuthe Siek
*Assistant Examiner*—Thuan Do
(74) *Attorney, Agent, or Firm*—Ronald O. Neerings; Wade James Brady, III; Frederick J. Telecky, Jr.

(57) ABSTRACT

The invention provides an algorithm for systematically determining and optimizing the physical implementation of an array of networks with a combination of matching series and parallel elements. Disclosed are the machine-implemented steps of defining the network in terms of a network value representing the sum of the elements. The network value is divided into an integer part and a proper fraction part. A partial quotient and residue are computed for the proper fraction part. Additional partial quotients and residues may be computed while the residue is significant. The physical implementation of the network is then described in terms of series and parallel elements represented by the integer part and the partial quotients. Also disclosed is a method of assembling a network from a combination of series and parallel elements. A network value consisting of an integer part and a proper fraction part are used to represent the network. A partial quotient and residue are computed for the proper fraction part, using as many iterations as needed until the residue becomes insignificant. The physical implementation of the network is described in terms of series and parallel elements represented by the integer part and the partial quotients and the described elements are coupled to form the network. A system for constructing a network from a combination of matching series and parallel elements is also disclosed. Means for executing an algorithm to determine the physical implementation of the network and means for coupling a quantity of matching series and parallel elements to form the network are indicated.

26 Claims, 9 Drawing Sheets

NUMERATORS (40)

| N/D | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| 2 | 2 | | | | | | | | | | | | | | | | | | | | | |
| 3 | 3 | 3 | | | | | | | | | | | | | | | | | | | | |
| 4 | 4 | 2 | 4 | | | | | | | | | | | | | | | | | | | |
| 5 | 5 | 4 | 4 | 5 | | | | | | | | | | | | | | | | | | |
| 6 | 6 | 3 | 2 | 3 | 6 | | | | | | | | | | | | | | | | | |
| 7 | 7 | 5 | 5 | 5 | 5 | 7 | | | | | | | | | | | | | | | | |
| 8 | 8 | 4 | 5 | 2 | 5 | 4 | 8 | | | | | | | | | | | | | | | |
| 9 | 9 | 6 | 3 | 6 | 6 | 3 | 6 | 9 | | | | | | | | | | | | | | |
| 10 | 10 | 5 | 6 | 4 | 2 | 4 | 6 | 5 | 10 | | | | | | | | | | | | | |
| 11 | 11 | 7 | 6 | 6 | 7 | 7 | 6 | 6 | 7 | 11 | | | | | | | | | | | | |
| 12 | 12 | 6 | 4 | 3 | 6 | 2 | 6 | 3 | 4 | 6 | 12 | | | | | | | | | | | |
| 13 | 13 | 8 | 7 | 7 | 6 | 8 | 8 | 6 | 7 | 7 | 8 | 13 | | | | | | | | | | |
| 14 | 14 | 7 | 7 | 5 | 7 | 5 | 2 | 5 | 7 | 5 | 7 | 7 | 14 | | | | | | | | | |
| 15 | 15 | 9 | 5 | 7 | 3 | 4 | 9 | 9 | 4 | 3 | 7 | 5 | 9 | 15 | | | | | | | | |
| 16 | 16 | 8 | 8 | 4 | 8 | 5 | 7 | 2 | 7 | 5 | 8 | 4 | 8 | 8 | 16 | | | | | | | |
| 17 | 17 | 10 | 8 | 8 | 7 | 8 | 7 | 10 | 10 | 7 | 8 | 7 | 8 | 8 | 10 | 17 | | | | | | |
| 18 | 18 | 9 | 6 | 6 | 7 | 3 | 7 | 6 | 2 | 6 | 7 | 3 | 7 | 6 | 6 | 9 | 18 | | | | | |
| 19 | 19 | 11 | 9 | 8 | 8 | 9 | 7 | 7 | 11 | 11 | 7 | 7 | 9 | 8 | 8 | 9 | 11 | 19 | | | | |
| 20 | 20 | 10 | 9 | 5 | 4 | 6 | 9 | 4 | 8 | 2 | 8 | 4 | 9 | 6 | 4 | 5 | 9 | 10 | 20 | | | |
| 21 | 21 | 12 | 7 | 9 | 9 | 5 | 3 | 7 | 5 | 12 | 12 | 5 | 7 | 3 | 5 | 9 | 9 | 7 | 12 | 21 | | |
| 22 | 22 | 11 | 10 | 7 | 8 | 6 | 10 | 6 | 8 | 7 | 2 | 7 | 8 | 6 | 10 | 6 | 8 | 7 | 10 | 11 | 22 | |
| 23 | 23 | 13 | 10 | 9 | 8 | 9 | 8 | 10 | 8 | 8 | 13 | 13 | 8 | 8 | 10 | 8 | 9 | 8 | 9 | 10 | 13 | 23 |

DENOMINATORS (42)

FRACTION BREAK-DOWN TABLE

*FIG. 4*

NUMERATORS (40)

| N/D | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| 2 | 2 | | | | | | | | | | | | | | | | | | | | | |
| 3 | 3 | 3 | | | | | | | | | | | | | | | | | | | | |
| 4 | 4 | 2 | 4 | | | | | | | | | | | | | | | | | | | |
| 5 | 5 | 4 | 4 | 5 | | | | | | | | | | | | | | | | | | |
| 6 | 6 | 3 | 2 | 3 | 5 | | | | | | | | | | | | | | | | | |
| 7 | 7 | 5 | 5 | 5 | 5 | 7 | | | | | | | | | | | | | | | | |
| 8 | 8 | 4 | 5 | 2 | 5 | 4 | 7 | | | | | | | | | | | | | | | |
| 9 | 9 | 6 | 3 | 6 | 6 | 3 | 6 | 9 | | | | | | | | | | | | | | |
| 10 | 10 | 5 | 6 | 4 | 2 | 4 | 6 | 5 | 6 | | | | | | | | | | | | | |
| 11 | 11 | 7 | 6 | 6 | 7 | 7 | 6 | 6 | 7 | 11 | | | | | | | | | | | | |
| 12 | 12 | 6 | 4 | 3 | 6 | 2 | 6 | 3 | 4 | 5 | 7 | | | | | | | | | | | |
| 13 | 13 | 8 | 7 | 7 | 6 | 8 | 8 | 6 | 7 | 7 | 8 | 13 | | | | | | | | | | |
| 14 | 14 | 7 | 7 | 5 | 7 | 5 | 2 | 5 | 7 | 5 | 7 | 7 | 7 | | | | | | | | | |
| 15 | 15 | 9 | 5 | 7 | 3 | 4 | 9 | 8 | 4 | 3 | 7 | 5 | 8 | 7 | | | | | | | | |
| 16 | 16 | 8 | 8 | 4 | 8 | 5 | 7 | 2 | 7 | 5 | 8 | 4 | 8 | 7 | 9 | | | | | | | |
| 17 | 17 | 10 | 8 | 8 | 7 | 8 | 7 | 10 | 10 | 7 | 8 | 7 | 8 | 8 | 10 | 15 | | | | | | |
| 18 | 18 | 9 | 6 | 6 | 7 | 3 | 7 | 6 | 2 | 6 | 7 | 3 | 7 | 6 | 5 | 9 | 8 | | | | | |
| 19 | 19 | 11 | 9 | 8 | 8 | 9 | 7 | 7 | 11 | 11 | 7 | 7 | 9 | 8 | 8 | 9 | 11 | 14 | | | | |
| 20 | 20 | 10 | 9 | 5 | 4 | 6 | 9 | 4 | 8 | 2 | 8 | 4 | 9 | 6 | 4 | 5 | 8 | 6 | 9 | | | |
| 21 | 21 | 12 | 7 | 9 | 9 | 5 | 3 | 7 | 5 | 12 | 12 | 5 | 7 | 3 | 5 | 8 | 9 | 7 | 8 | 8 | | |
| 22 | 22 | 11 | 10 | 7 | 8 | 6 | 10 | 6 | 8 | 7 | 2 | 7 | 8 | 6 | 9 | 6 | 8 | 7 | 8 | 11 | 8 | |
| 23 | 23 | 13 | 10 | 9 | 8 | 9 | 8 | 10 | 8 | 8 | 13 | 13 | 8 | 8 | 10 | 8 | 9 | 8 | 9 | 10 | 13 | 16 |

DENOMINATORS (42)

MODIFIED FRACTION BREAK-DOWN TABLE

*FIG. 6*

IMPLEMENTATION OF NETWORKS USING PARALLEL AND SERIES ELEMENTS

TECHNICAL FIELD

The present invention relates in general to systems, methods, and algorithms for describing and implementing networks with parallel and series elements. More particularly, the invention relates to the systematic design and implementation of networks using combinations of matching series and parallel elements.

BACKGROUND OF THE INVENTION

In a network (M) which may be characterized by the quotient of a cross-quantity and a through-quantity, M=cross-quantity/through-quantity, it is generally known that certain relationships govern series and parallel network elements. For example, in an electrical resistor network, resistance (R) is the quotient of voltage (V) and current (i), R=V/i. It is well known that series elements are additive, e.g. $R_{equivalent}=(R_1+R_2+R_3+ \ldots R_N)$, and that the equivalent resistance of parallel resistor elements is described by the relationship, $R_{equivalent}^{-1}=(R_1^{-1}+R_2^{-1}+R_3^{-1}+ \ldots R_N^{-1})$. Such relationships hold true for other physical networks M as well.

In many engineering applications the problem of how to implement a network using multiple identical elements is encountered. Often such an implementation is sought in order to reduce the influence of unfavorable factors. In integrated circuit layout for example, the effects of an uneven temperature gradient, nonuniform distribution of process layers, and noise emissions from adjacent circuit blocks, may be alleviated by implementing a desired network value, such as resistance or capacitance, using smaller individual elements rather than using one lump-sum component.

Problems arise however, in attempting to describe a network using a combination of series and parallel elements. It is often desirable to use elements with matching physical characteristics. The use of matching network elements helps to equalize the effects of thermal gradients and material gradients and other unfavorable factors. The use of matching elements is also often desirable from a manufacturing standpoint. It is known in the arts to approach the breakdown of a network into series and parallel elements using some degree of trial and error. The problem is made more complex by concerns such as, in the example of integrated circuit and design, the desire to minimize die area and the desire to minimize the count of individual network elements or to utilize elements of a particular value or size.

It would be useful and advantageous in the arts to provide algorithms, systems, and methods for systematically describing networks in terms of series and parallel elements. Additional uses and advantages would be inherent in algorithms, systems, and methods also capable of optimizing a network implementation while reducing the need for manual trial and error approaches common in the arts.

SUMMARY OF THE INVENTION

In general, the present invention provides systems, methods, and algorithms for designing and implementing networks using a combination of series and parallel elements.

According to a preferred embodiment of the invention, an algorithm for determining the physical implementation of a network with a combination of matching series and parallel elements defines the network in terms of a network value representing the assembled value of the total equivalence of the elements. The network value is divided into an integer part and a proper fraction part. A partial quotient and residue are computed for the proper fraction part. Additional partial quotients and residues may be computed while the residue remains significant. The physical implementation of the network is then described in terms of series and parallel elements represented by the integer part and the partial quotients.

According to another aspect of the invention, a significance level for the residue is selected.

According to still another aspect of the invention, alternative expressions may be used for the division of the network value into an integer part and a proper fraction part.

According to yet another aspect of the invention, a physical implementation of the network is selected based on one or more optimization criteria.

According to one preferred embodiment of the invention, a method of assembling a network from a combination of series and parallel elements is provided. A network value consisting of an integer part and a proper fraction part is used to represent the network. A partial quotient and residue are computed for the proper fraction part, using as many iterations as needed until the residue becomes insignificant. The physical implementation of the network is described in terms of series and parallel elements represented by the integer part and the partial quotients. The described series and parallel elements are coupled to assemble the network.

According to another aspect of the invention, the network may be optimized by selecting the minimum number of elements.

According to another aspect of the invention, the network may be optimized by selecting the minimum value of an object function of the elements such as the total area occupied by the elements.

According to another aspect of the invention, a step of selecting a matching tolerance for the series and parallel elements may be used.

According to another aspect of the invention, an element value may be preselected for use in determining network implementations using a quantity of the preselected-value elements deployed in series and in parallel.

According to another embodiment of the invention, a system for constructing a network from a combination of matching series and parallel elements is provided. The system includes means for executing an algorithm to determine the physical implementation of the network and means for coupling a quantity of matching series and parallel elements to form the network.

The invention provides several technical advantages including but not limited to increased efficiency in network design and implementation, improved accuracy in network design and network component matching, and efficiency in providing design alternatives for use in evaluating potential network layouts according to selected optimization criteria.

BRIEF DESCRIPTION OF THE DRAWINGS

The above and additional features and advantages of the present invention will be more clearly understood from consideration of the following detailed description in connection with the accompanying drawings in which:

FIG. 4 is a table illustrating an example of the systematic determination of elements representing fraction parts;

FIG. 6 is a table illustrating an alternative example of the systematic determination of elements representing fraction parts;

References in the detailed description correspond to like references in the figures unless otherwise noted. Like numerals refer to like parts throughout the various figures. The descriptive and directional terms used in the written description such as top, bottom, left, right, etc., refer to the drawings themselves as laid out on the paper and not to physical limitations of the invention unless specifically noted. The drawings are not to scale and some features of embodiments shown and discussed are simplified or exaggerated for illustrating the principles of the invention.

DETAILED DESCRIPTION OF PREFERRED EMBODIMENTS

The invention provides for the systematic breakdown of an arbitrary array into a combination of networks of series and parallel elements. The invention may be used for networks which can be expressed in terms of a cross-quantity divided by a through-quantity such as, for example, an electronic network in which by Ohm's law, resistance equals voltage divided by current. Although for the sake of example the invention is described in terms of electronic resistor networks, it should be understood that the algorithms, methods, and systems described are applicable to other electrical and mechanical networks, such as a network of inductors or fluid pumps, without departure from the concepts of the invention.

Figure 1A:
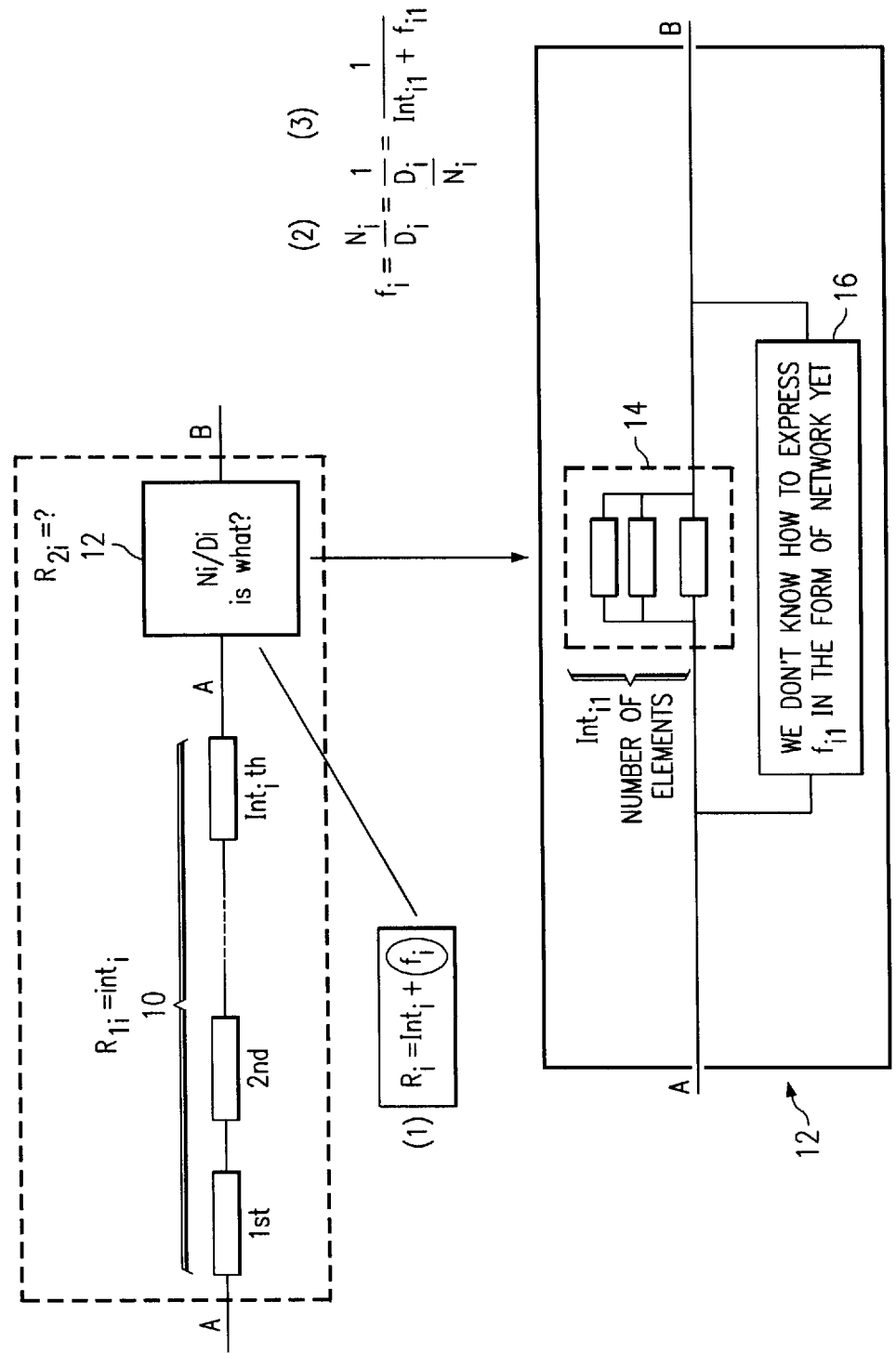
FIG. 1A is a block diagram illustrating the systematic determination of the implementation of a network with a combination of series and parallel elements using an integer part and a fraction part.
Figure 1B:
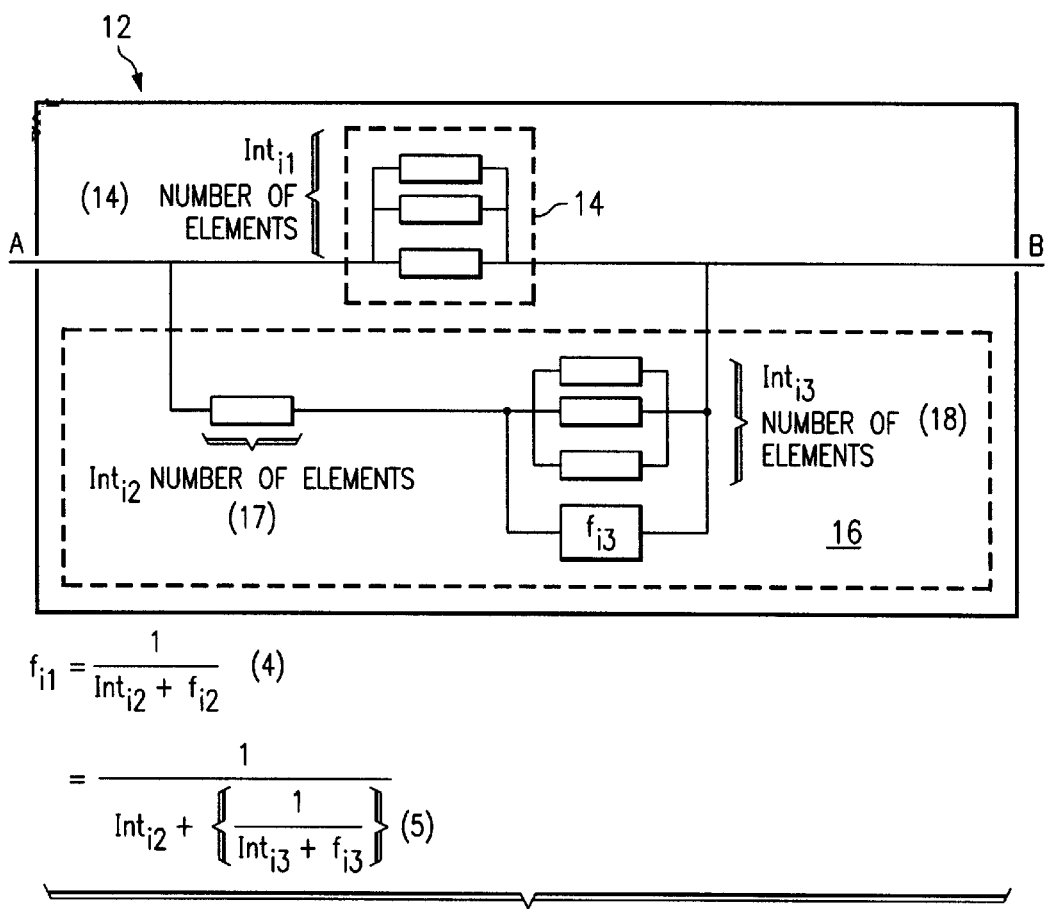
FIG. 1B is a block diagram illustrating the systematic determination of the implementation of a network with a combination of series and parallel elements using an integer part and a fraction part having a partial quotient and a residue.

Given a particular network resistance value, there are a very large number of possible implementations using various numbers of various sizes of individual resistor elements. In the implementation of physical networks, engineering considerations narrow the possible implementations. For example it may be desirable to use a particular resistor element value for the implementation of a network, or it may be desirable to implement the network within a particular area of an integrated circuit. Generally, it is preferred in the electronic arts to use matching network elements. Referring to FIGS. 1A and 1B, an example of the systematic breakdown of a network using the invention is shown. Preferably, the network is expressed in terms of a given value, e.g. resistance, $R_i$.

As shown in equation (1), for a given resistor value for the network, $R_i$, which has been normalized for the assumed resistor element value, the resistance may be expressed as an integer part $Int_i$ and a fraction part $f_i$:

$$R_i = Int_i + f_i \qquad (1).$$

Indicated in FIG. 1A, the integer part of a given resistance value, $R_i$, may be implemented with $Int_i$ series resistors 10. The fraction part ($f_i$) 12, however is by definition less than one. A proper fraction $f_i$ has a numerator less than the denominator as shown by:

$$f_i = N_i/D_i \qquad (2)$$

where $N_i < D_i$. Reversing the proper fraction of equation (2) produces the expression:

$$(N_i/D_i)^{-1} = D_i/N_i = (Int_{i1} + f_{i1})^{-1} \qquad (3),$$

where $Int_{i1}$ is a positive integer and $f_{i1}$ is another proper fraction. $Int_{i1}$ is denominated the partial quotient and $f_{i1}$ is denominated the residue. Since $f_i$ is representative of a physical quantity, in this example resistance, then its inverse, here expressed as $(Int_{i1} + f_{i1})^{-1}$, is representative of the appropriate inverse physical quantity, in this case conductance. In terms of the network, since $Int_{i1}$ is a positive integer representative of conductance, it indicates $Int_{i1}$ resistor segments connected in parallel 14.

The residue, $f_{i1}$, is not yet described in terms of equivalent resistors as shown by box 16. Referring to FIG. 1B, the residue $f_{i1}$ is not an integer, therefore its numerator and denominator may be reversed in order to compute the partial quotient and residue where:

$$f_{i1} = (Int_{i2} + f_{i2})^{-1} \qquad (4).$$

In this case, since $f_{i1}$ is representative of conductance, its inverse, here expressed as $(Int_{i2} + f_{i2})^{-1}$, represents resistance, and indicates resistors coupled in series 17. As in the previous iteration, the second residue $f_{i2}$ is a proper fraction part of the resistance value and may be further broken down into a third partial quotient and third residue:

$$f_{i2} = (Int_{i3} + f_{i3}) \qquad (5).$$

Thus the breakdown may be reiterated as many times as necessary until no residue is obtained, e.g.:

$$f_{iN} = 0 \qquad (6).$$

Preferably, a significance level is selected for the fraction part and the iterations are discontinued when the residue becomes insignificant. The series and parallel network elements indicated may then be used to describe the implementation of the network.

Figure 2:
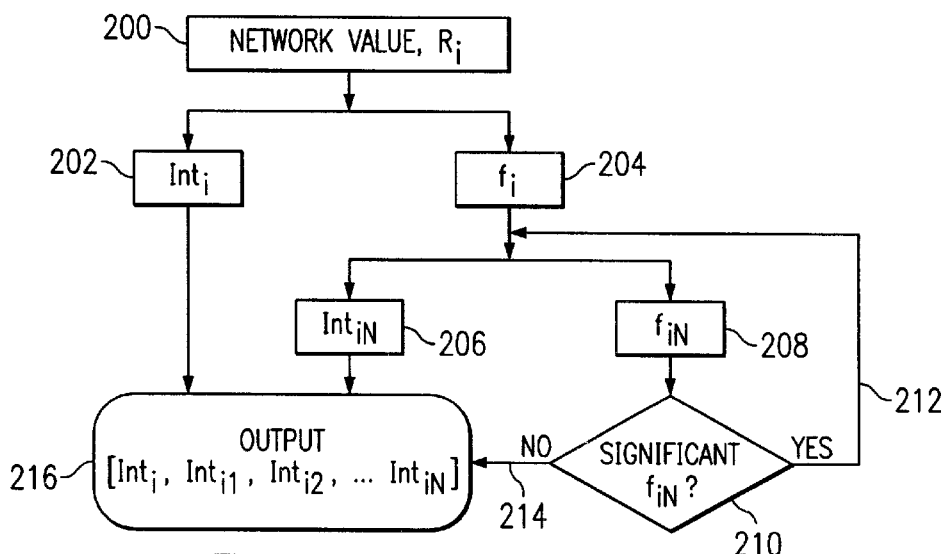
FIG. 2 is a process flow diagram showing an example of steps of a preferred embodiment of the invention.

Understanding of the invention may be enhanced with reference to the process flow diagram of FIG. 2. The steps of determining the implementation of a network are shown beginning with a network expressed in terms of a normalized network value representative of the network as a whole 200. The normalized network value is expressed in terms of an integer part 202 and a fraction part 204. The network value may initially be expressed in the form of a decimal. Within the tolerances dictated by the particular physical application, the decimal portion of the network value is preferably converted to the form of a proper fraction. For the fraction part 204, a partial quotient 206 and a residue 208 are computed. As shown by decision diamond 210, the residue 208 is preferably checked for significance. A significance level may be preselected according to the requirements of the application, or by default wherein a partial quotient is obtained without a residue. As indicated by arrow path 212, if the residue is significant, the partial quotient and fraction part of the residue are computed, reiterating steps 206 and 208. Again, the significance of the resulting residue is evaluated 210, and the computation of a partial quotient and residue may continue for another iteration. In principle, the iterations may continue until no residue is obtained, but typically a significance level is used in order to reduce the number of computations performed. As shown by arrow path 214, when the residue becomes insignificant, the final step of outputting the results 216 is reached.

In the output step 216, each partial quotient, $Int_{iN}$, is a part of the output that describes a portion of the network in terms of series or parallel network elements. Whether a particular partial quotient represents elements in series or elements in parallel is dependent upon whether the initial physical quantity or its inverse is represented by the particular iteration producing the particular partial quotient. The output alternates between series and parallel elements, or vice versa, depending on the physical quantity represented by the initial network value. For the sake of the present example, beginning with the initial network value as an expression of resistance, its integer part, $Int_i$, describes elements connected in series. The conductance represented by the first partial quotient, $Int_{i1}$, describes parallel elements, the second partial quotient, $Int_{i2}$, describes series elements, the third partial quotient, $Int_{i3}$, describes parallel elements, and so forth.

It should be understood that depending on the matching element value used for the normalized network value, the description of the implementation of the network obtained as described is not necessarily unique. Preferably the steps may be repeated by a machine to obtain all possible solutions, or at least a number of likely solutions, such that a particular solution may be selected. Preferably this is accomplished by varying the selection of an integer part $Int_i$ 202 and a fraction part $f_i$ 204 to describe the network. For example, some or all of the integer part may be combined with the fraction part. This may be illustrated by the following numerical example.

Assuming a network value of $R_i=3.875$ the integer part may be expressed as $Int_i=3$, and the fraction part as $f_i=7/8$. Alternatively, the integer part may be expressed as $Int_i=2$ and the fraction part as $f_i=15/8$. Or for reasons further discussed below, it may be more desirable to express the network value $R_i$ in this instance as the integer part $Int_i=3$ and a fraction part having more than one subpart, such as $f_i=(4/8+3/8)$. Many alternative expressions of the network value are possible for determining alternative descriptions for the implementation of a network.

The selection of a particular network description is preferably made using one or more optimization criteria such as the minimum number of individual network elements and the minimum area are required for the implementation of the network, to name two examples. Of course alternative or additional optimization criteria may be used.

The described physical implementation of a network thus obtained may be used for assembling the network by coupling the indicated parallel and series elements. Now referring primarily to FIGS. 3A and 3B, a numerical example of the systematic breakdown of a resistor network 30 is described. Assume for the sake of example that a resistor network array 30 is to be constructed having a subnetwork 32 with a total resistance value of 48.53 kΩ and another subnetwork 34 having a total resistance value of 3 kΩ. Further assume that it is desired to use individual resistor elements 36 each having a value of 4.5 kΩ.

Figure 3A:
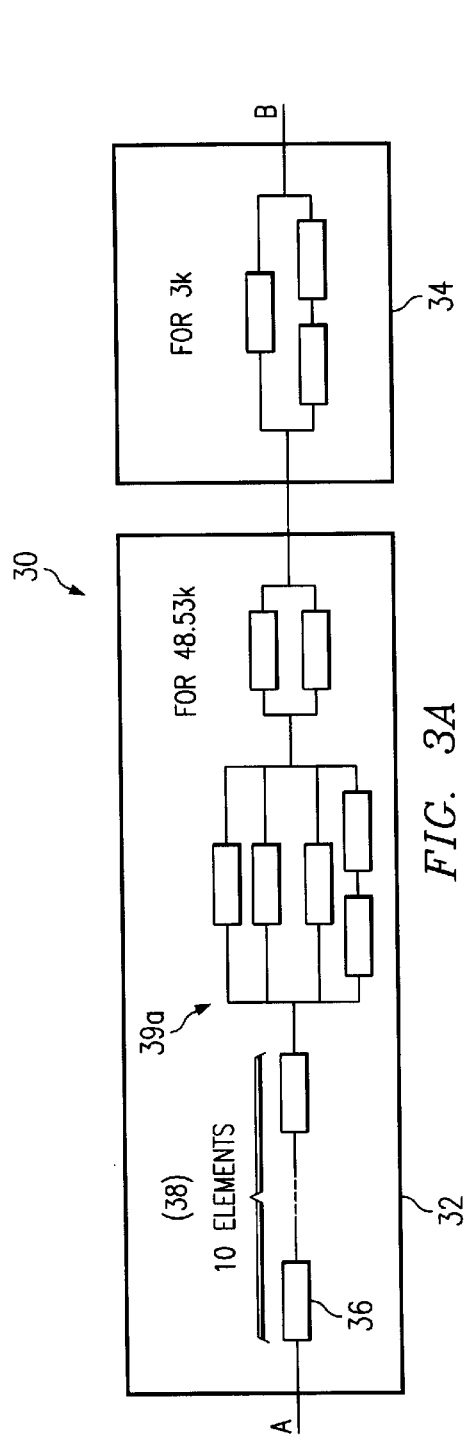
FIGS. 3A and 3B are block diagrams further illustrating an example of the use of the invention for the implementation of a network.
Figure 3B:
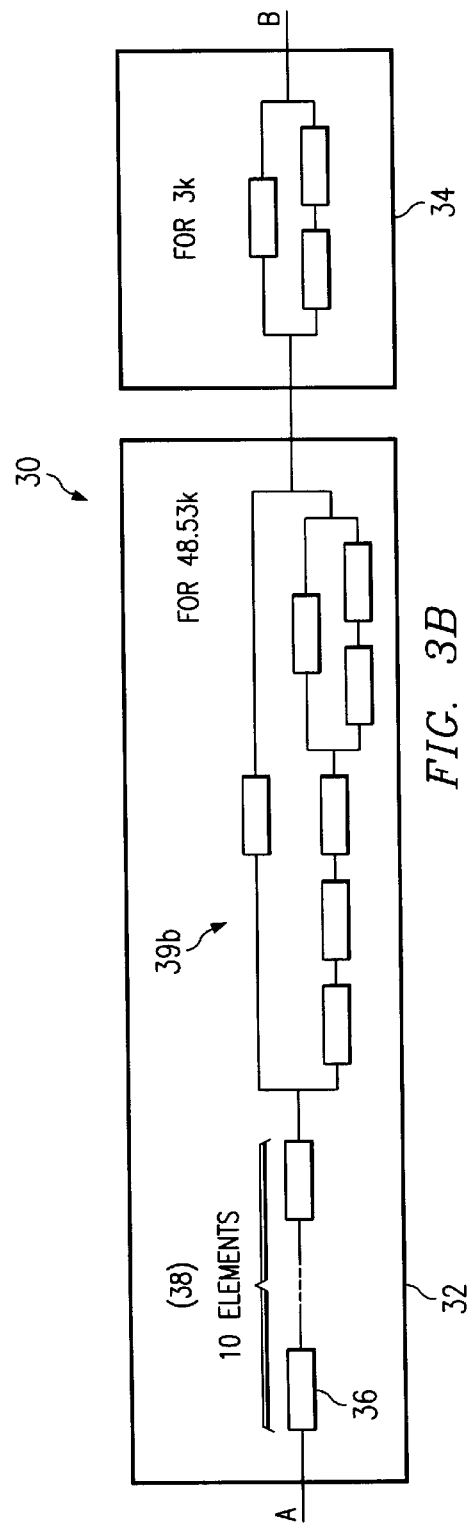

FIGS. 3A and 3B are graphical representations of a network 30 described using the techniques disclosed herein. As indicated in both FIGS. 3A and 3B, an identical portion 38 of the network is implemented using ten 4.5 kΩ resistor elements 36 connected in series. It should be clear to those skilled in the arts that ten 4.5 kΩ resistor elements 36 connected in series produce an equivalent resistance of 45 kΩ. In both FIGS. 3A and 3B the groups of ten series elements 38 are followed by a subnetwork of parallel resistor elements, 39a and 39b respectively. The subnetworks of parallel resistor elements shown in the FIGS. 3A and 3B are not identical, reflecting that more than one solution exists for the given network 30 design criteria. The parallel arrangement 39a of FIG. 3A and the arrangement 39b of FIG. 3B each use seven elements in different configurations. Both configurations 39a, 39b describe the network 30 within the parameters of the example. In the rightmost subnetworks 34 of both FIGS. 3A and 3B, the 3 kΩ subnetwork 34 is identically implemented using three 4.5 kΩ resistor elements 36 in a series/parallel arrangement.

Those skilled in the arts may appreciate that by changing the parameters of the above example, permitting the individual resistor element value to be selected from the range between 3 kΩ and 6 kΩ, the invention may be used to produce the following additional results. Using a resistor element of value of 5.994 kΩ, only 15 individual resistor elements are required, giving the minimum number of elements needed for implementing the network under the given criteria. Using a resistor element value of 3.882 kΩ, 22 segments are required which, using standard semiconductor processes, may be arranged to use the minimum possible die area for implementing the network. The systematic network breakdown techniques of the invention may thus be used to optimize the network according to selected criteria. This relatively simple example is presented for the purpose of explaining the invention, of course the invention may be used with networks considerably more complex having much larger arrays of subnetworks.

Further appreciation of the invention may be gained with reference to FIG. 4. A fraction breakdown table is shown demonstrating the partial quotients obtained when breaking down common fractions according to the described techniques. The columns 40 represent numerators and the rows 42 represent denominators, cross-referencing numerator with denominator provides an indication of the number of elements into which the fraction may be broken down. For example referring to the numerator 1 and the denominator 2 (44, 46), the table indicates that 2 elements (48) may be used for the physical implementation of the fraction ½. Referring to the dotted line 49 running diagonally through the table, it can be seen that equivalent fractions such as for example 5/10 and 9/18, may also be implemented using two parallel elements.

It can be seen that the values of the table are symmetrical about the dotted line 49. It can also be observed with reference to FIG. 4 that fractions closer to zero or one require more elements to implement than those nearer to ½. For example, ⅞ or ⅛ require 8 elements to implement, whereas 4/8 can be implemented using 2 elements. Thus returning to the example discussed above with reference to FIG. 2, the fraction ⅞ may be broken down into 8 elements as described, or may preferably be broken down into 7 elements by using (4/8+3/8), yielding 2 elements in series with 5 elements as shown by the table.

Figure 5:
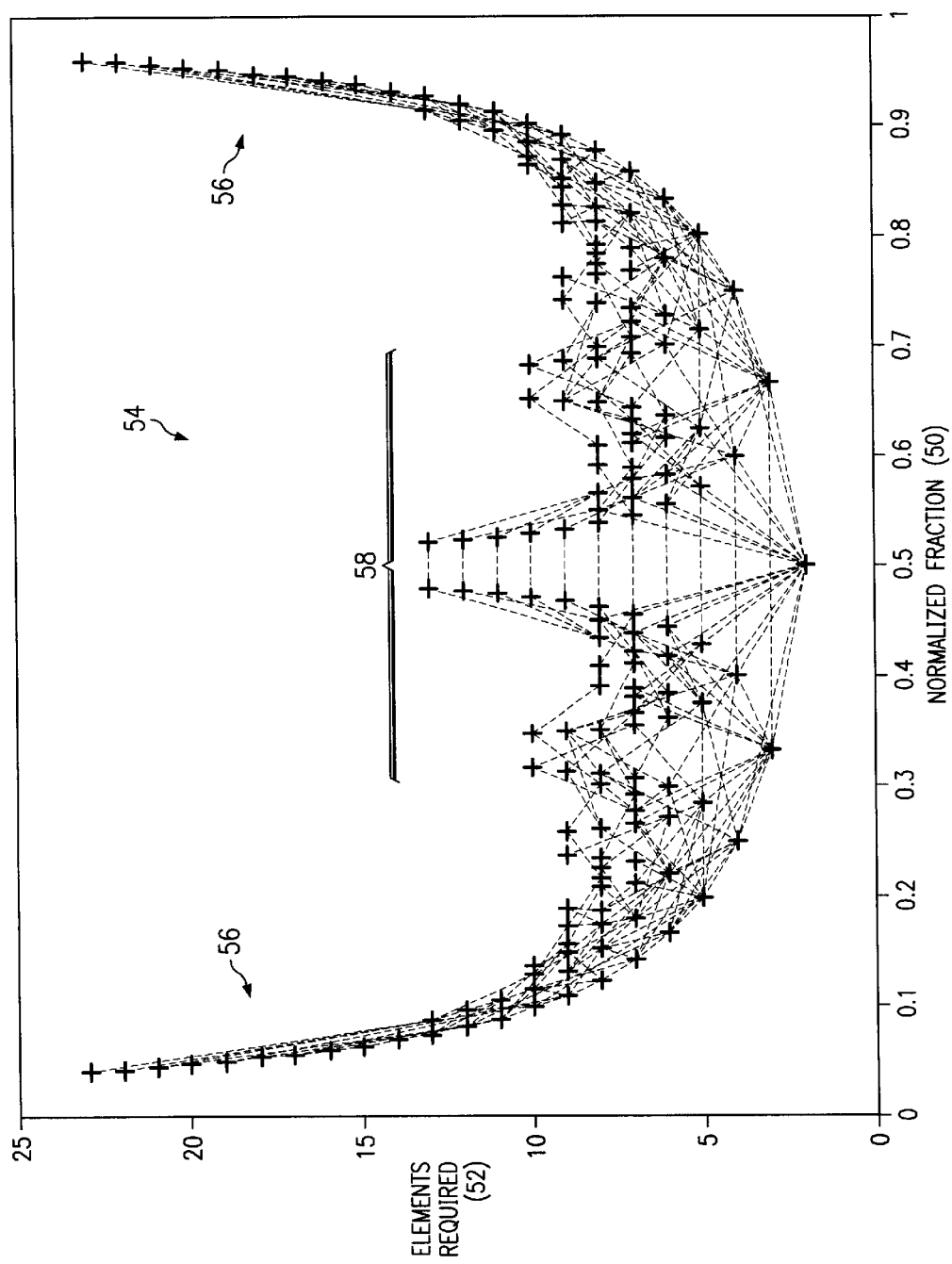
FIG. 5 is a graphical illustration of the distribution of the systematically determined elements shown in FIG. 4.

FIG. 5 presents a graphical depiction of the distribution of the fraction breakdown table of FIG. 4. The normalized fraction values are shown on the horizontal axis 50 and the number of elements required for the physical implementation of the fraction part are shown on the vertical axis 52. It can be seen by the distribution 54 of the points of FIG. 5, each representative of a table entry shown on FIG. 4, that fractions 56 closer to zero and one require more elements to implement and that fractions 58 closer to ½ are more economical terms of the number of elements required.

Figure 7:
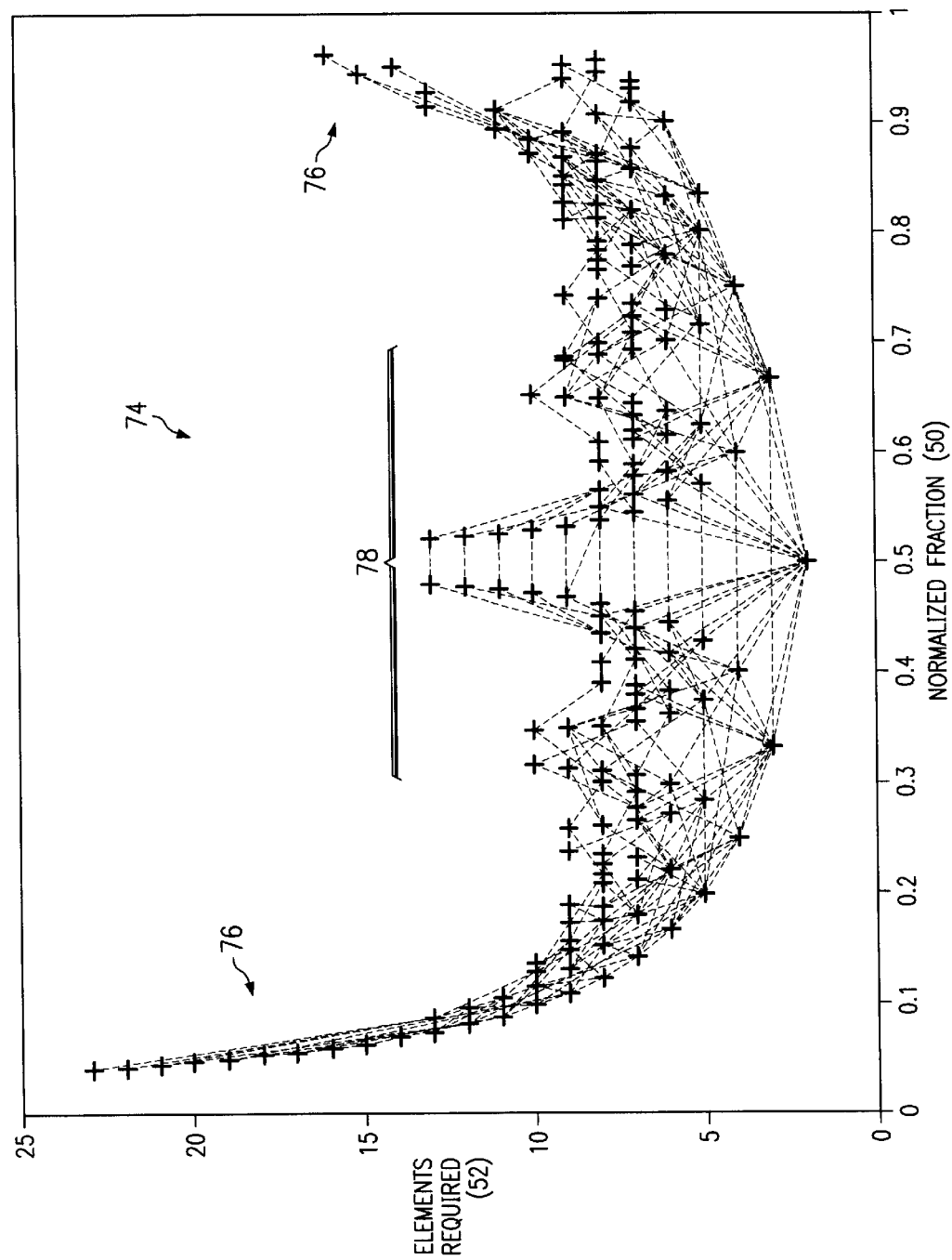
FIG. 7 is a graphical illustration of the distribution of the systematically determined elements shown in FIG. 6.

FIG. 6 shows a modified fraction breakdown table obtained by substituting combinations of fractions closer to ½ for fractions approaching one. In other respects, the table of FIG. 6 is similar to that of FIG. 4, however, as can be seen by the bold table entries 50, in many cases the number of elements required to implement a particular fraction is reduced. This result is emphasized by the graphical representation of FIG. 7 showing the distribution 74 of the table entries of FIG. 6 and reflecting the reduction in the number of network implementations described using a high element count 76, and the corresponding increase in data points 78 closer to ½.

Figure 8A:
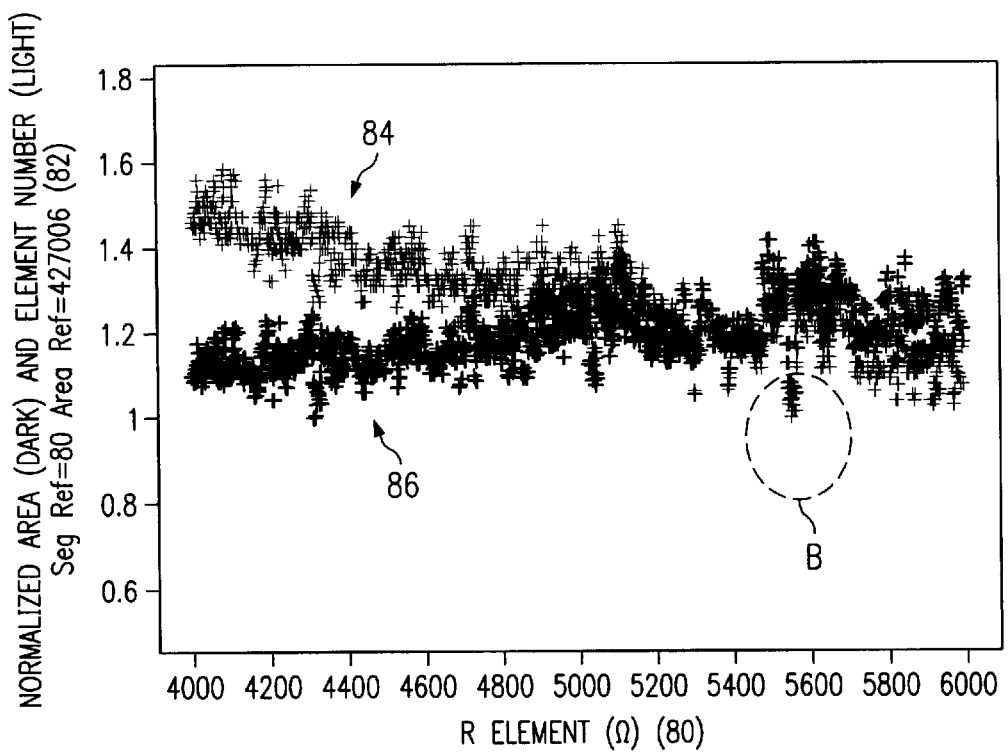
FIG. 8A is a graphical illustration of normalized area and element count for an exemplary network using the systematic breakdown of the invention.
Figure 8B:
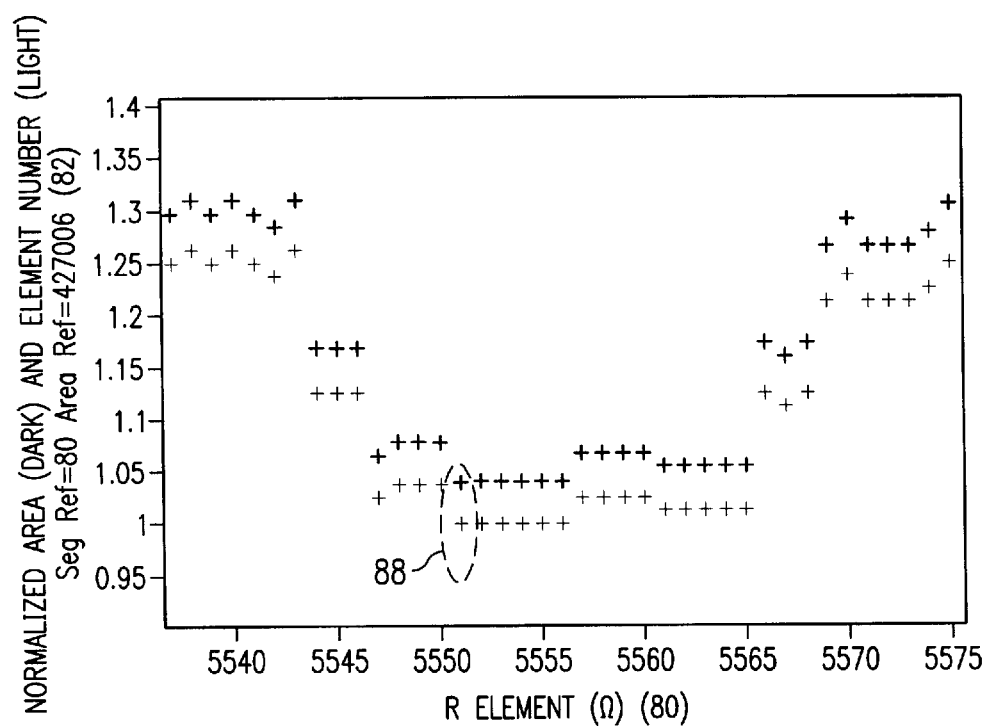
FIG. 8B is a close-up view of the section enclosed by ellipse B of FIG. 8A.

FIGS. 8A an 8B illustrate the selection of network implementations described by the invention according to various optimization criteria. Possible implementations of a resistor network using resistor elements from within the range of 4 kΩ to 6 kΩ are shown in FIGS. 8A and 8B describing the implementation of the resistor network array, R=[$R_1$, $R_2$, . . . $R_5$]=[118.5 kΩ, 38.9 kΩ, 61.1 kΩ, 164.1 kΩ, 7.561 kΩ]. The array is normalized by element value. Each member of the normalized array represents a network value. Thus, each member of the array may be implemented by a network according to the invention as described. The horizontal axis 80 represents the normalized resistor element value and the vertical axis 82 represents the normalized area and number of elements required to implement the given resistor array R. The lighter data points 84 represent the number of resistor elements required for implementation of the array and the darker data points 86 represent the area required for implementation of the resistor array on a semiconductor die. FIG. 8A depicts the descriptions of the network array R obtained using the invention. Such data is preferably used in further steps of the invention for selecting optimal network implementations from the numerous network descriptions.

FIG. 8B is a close-up view of the section of FIG. 8A indicated by ellipse B. As can be seen in FIG. 8B, the network implementation described by the points enclosed by ellipse 88, indicating the use of eighty 5.551 kΩ resistors and a die area of 444 kΩ, provides a network having both a relatively low element count 84 and a relatively small area 86 compared to other possible solutions shown on FIGS. 8A and 8B. Thus the systematic steps of the invention may be used to describe the proposed network in numerous implementations and provide further steps for selecting optimal solutions based on selected criteria including element count and area.

Error criteria may be used for determining whether an array is sufficiently broken down into series and parallel network elements. It should be understood that optimization is for the overall implementation of the array and not merely for individual elements or subnetworks. The matching error is a measure of how closely the element combinations match the targeted network values. In the above example, the network R=[118.5 kΩ, 38.9 kΩ, 61.1 kΩ, 164.1 kΩ, 7.561 kΩ], was implemented with $R_{network}$=[118.420 kΩ, 38.857 kΩ, 61.061 kΩ, 163.750 kΩ, 7.5695 kΩ].

$$R_{err} = (R_{network} - R)/R \qquad (7).$$

Thus, the matching error $R_{err}$=[0.066%, 0.11%, 0.064%, 0.21%, −0.11%], shows how closely each combination of series and parallel elements matches its target value.

The ratio matching error of the network as a whole, that is, the network as seen from the point of view of its input and output terminals, may also be computed.

$$R_{error\ ratio}(i) = \frac{\sum_{j=1}^{i} R_{network}(j) \div \sum_{j=1}^{n} R_{network}(j) - \sum_{j=1}^{i} R(j) \div \sum_{j=1}^{n} R(j)}{\sum_{j=1}^{i} R(j) \div \sum_{j=1}^{n} R(j)}. \qquad (8)$$

Using equation (8) for the example, $R_{error\ ratio}$=[0.061%, 0.050%, 0.054%, −0.005%, 0%], indicating how closely the network implementation approaches the desired network.

Figure 9:
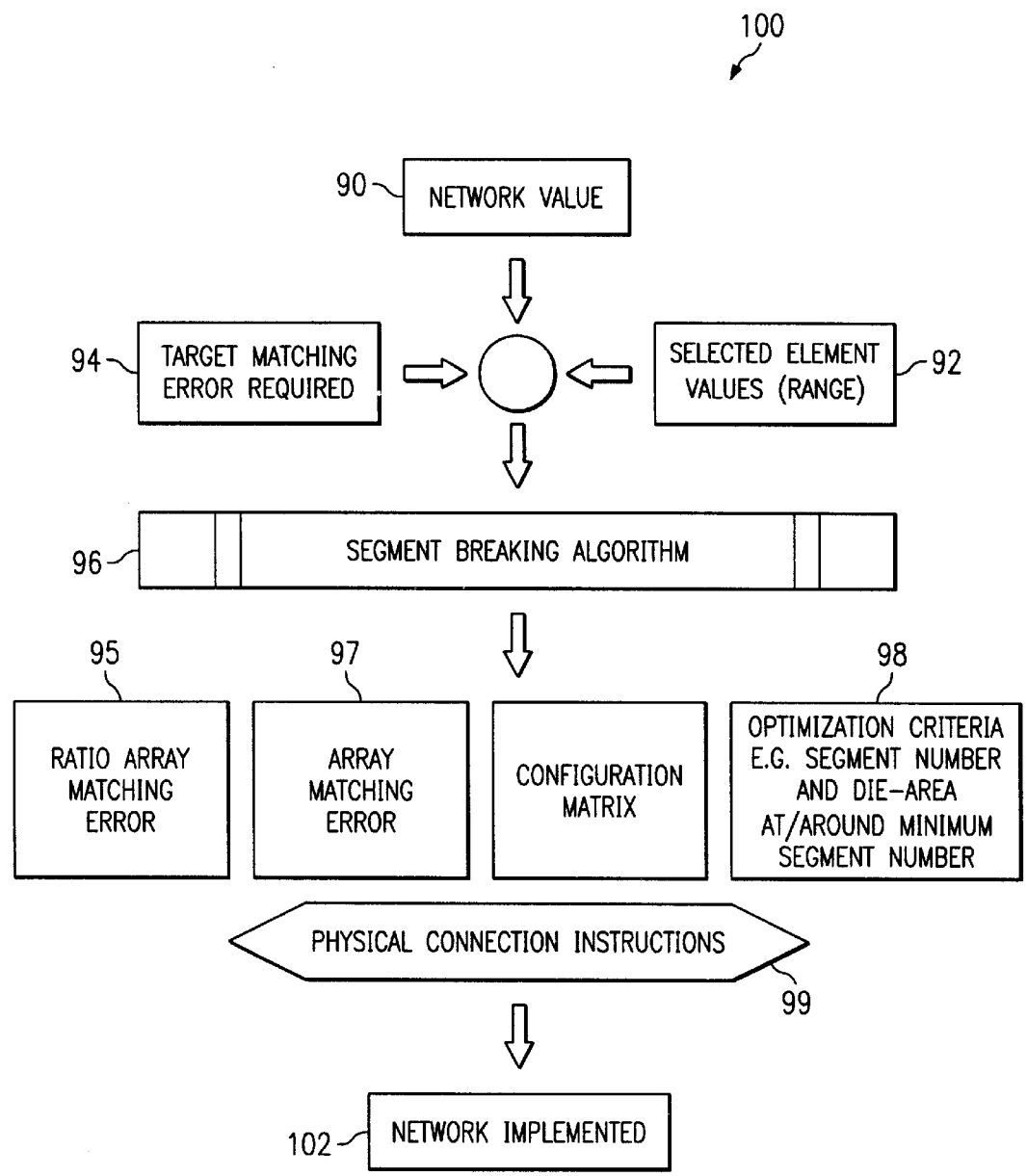
FIG. 9 is a block diagram depicting an example of a preferred system of the invention.

FIG. 9 illustrates an example of a preferred embodiment of a system of the invention. An initial network value 90, and selected element value 92 or a range of desired element values, and a targeted matching error requirement 94 are preferably input to a machine 100 for executing an algorithm 96 for determining the physical implementation of the network with a combination of matching series and parallel elements. The resulting output is preferably checked for error compliance, preferably ratio array matching error 95 and array matching error 97. The selection of a network implementation description may then be made according to one or more optimization criteria 98. Physical connection instructions 99 are then generated for machine implementation 102 in laying out the physical network.

The invention provides systems, methods, and algorithms for determining and implementing a network using matched parallel and series elements. The invention provides many advantages including providing for systematic determination and implementation of potential configurations for a particular network. Further advantages are realized in selecting optimal network implementations based on selected criteria. While the invention has been described with reference to illustrative embodiments, this description is not intended to be construed in a limiting sense. Various modifications and combinations of the illustrative embodiments as well as other embodiments of the invention will be apparent to persons skilled in the art upon reference to the description and claims.

We claim:

1. An algorithm for determining the physical implementation of a network with a combination of matching series and parallel elements comprising the steps of:
    defining the network in terms of a normalized network value representing the equivalence of the elements;
    dividing the network value into an integer part and a proper fraction part;
    determining a partial quotient and residue for the proper fraction part;
    reiterating the determining step until the residue becomes insignificant; and
    describing the physical implementation of the network in terms of series and parallel elements represented by the integer part and partial quotients.

2. The algorithm according to claim 1 further comprising the step of selecting a significance level for the residue for use in reiterating the determining step.

3. The algorithm according to claim 1 further comprising the steps of:
    reiterating the dividing step using alternative expressions of the integer part and the proper fraction part; and reiterating the describing step for each iteration of the dividing step.

4. The algorithm according to claim 3 further comprising the step of selecting a described physical implementation of the network based on one or more optimization criteria.

5. The algorithm according to claim 4 further comprising the step of selecting the minimum number of elements as an optimization criterion.

6. The algorithm according to claim 4 further comprising the step of selecting the minimum area of the network as an optimization criterion.

7. The algorithm according to claim 1 further comprising the step of selecting a matching error tolerance for the series and parallel elements.

8. The algorithm according to claim 1 further comprising the step of selecting an element value for use in the describing step.

9. The algorithm according to claim 1 further comprising the step of selecting a network area for use in the describing step.

10. A method of assembling a network comprised of a combination of matching series and parallel elements comprising the steps of:
representing the network in terms of a normalized network value consisting of an integer part and a proper fraction part;
determining a partial quotient and residue for the proper fraction part;
reiterating the determining step until the residue becomes insignificant;
describing the physical implementation of the network in terms of series and parallel elements represented by the integer part and the partial quotients; and
coupling the described series elements with the described parallel elements to form a network.

11. The method according to claim 10 further comprising the step of selecting a significance level for the residue for use in reiterating the determining step.

12. The method according to claim 10 further comprising the steps of:
reiterating the representing step using alternative expressions of the integer part and the proper fraction part;
reiterating the describing step for each iteration of the representing step; and then
selecting a described physical implementation of the network based on one or more optimization criteria.

13. The method according to claim 12 further comprising the step of selecting the minimum number of elements as an optimization criterion.

14. The method according to claim 12 further comprising the step of selecting the minimum area of the network as an optimization criterion.

15. The method according to claim 10 further comprising the step of selecting a matching error tolerance for the series and parallel elements.

16. The method according to claim 10 further comprising the step of preselecting an element value for use in the describing and coupling steps.

17. The method according to claim 10 further comprising the step of preselecting a network area for use in the describing step.

18. An algorithm for determining the physical implementation of an array of networks, each implemented with a combination of matching series and parallel elements, comprising the steps of:
defining the array of networks in terms of an array of normalized network values representing the equivalence of the elements of each network;
dividing each network value into an integer part and a proper fraction part;
determining a partial quotient and residue for each proper fraction part;
reiterating the determining step for each residue until the residue becomes insignificant; and
describing the physical implementation of the array of networks in terms of series and parallel elements represented by the integer parts and partial quotients.

19. The algorithm according to claim 18 further comprising the step of selecting one or more significance levels for the residue for use in reiterating the determining step.

20. The algorithm according to claim 18 further comprising the steps of:
reiterating the dividing steps using alternative expressions of the integer part and the proper fraction part; and
reiterating the describing step for each iteration of the dividing step.

21. The algorithm according to claim 20 further comprising the step of selecting a described physical implementation of the array based on one or more optimization criteria.

22. The algorithm according to claim 21 further comprising the step of selecting the minimum number of elements as an optimization criterion.

23. The algorithm according to claim 21 further comprising the step of selecting the minimum area of the array as an optimization criterion.

24. The algorithm according to claim 19 further comprising the step of selecting a matching error tolerance for the series and parallel elements.

25. The algorithm according to claim 18 further comprising the step of selecting an element value for use in the describing step.

26. The algorithm according to claim 18 further comprising the step of selecting an array area for use in the describing step.

* * * * *